March 8, 1966 P. R. WIEDERHOLD 3,239,725

SUPERCONDUCTING DEVICE

Filed Dec. 4, 1962

United States Patent Office 3,239,725

Patented Mar. 8, 1966

3,239,725

SUPERCONDUCTING DEVICE

Pieter R. Wiederhold, Lexington, Mass., assignor to Ion Physics Corporation, Burlington, Mass., a corporation of Delaware Filed Dec. 4, 1962, Ser. No. 242,139
2 Claims. (Cl. 317—158)

This invention relates to superconducting coils and more particularly to a novel method and means whereby such coils can be operated in higher magnetic fields and at higher current densities than has heretofore been possible.

Certain metals and alloys exihibit the unique property of having substantially zero electrical resistivity and magnetic permeability when in a so-called superconducting state. The transition of such a metal or alloy from a normal to a superconducting condition depends primarily upon the temperature, current density and the magnetic field at its surface. That is, for any metal or alloy capable of exhibiting superconducting properties, there exists a critical temperature $T_c$ (near absolute zero). A superconducting current can be generated only at temperatures below $T_c$ and the maximum superconducting current density depends on the magnetic field at the surface of the superconducting material. The area enclosed by a transition curve, such as is illustrated by curve 8 of the hereinafter described FIGURE 1, represents the superconducting state of the material. Generally, the lower the operating temperature, the larger this area, resulting in a higher critical magnetic field $H_c$ and a higher obtainable current density in the superconducting state at fields less than $H_c$.

When a superconducting device takes the form of a coil or solenoid or the like, the inherent non-uniformity of its magnetic field distribution results in the loss of superconducting properties at a current density substantially less than that theoretically possible for the material from which the coil is fabricated. It is toward the improvement of this condition that the present invention is directed.

Accordingly, it is a principal object of this invention to provide a new and improved superconducting coil.

It is another object of this invention to provide a novel method of diverting magnetic flux away from the inner circumference of a superconducting coil.

Another related object of this invention is to provide a superconducting solenoid having a plurality of segments of superconducting material periodically disposed along the inner circumference thereof so as to effectively reduce the magnetic flux residing therein.

These, together with other objects and features of this invention, will become more readily apparent from the following detailed description when taken in conjunction with the accompanying drawings wherein.

Figure 1:
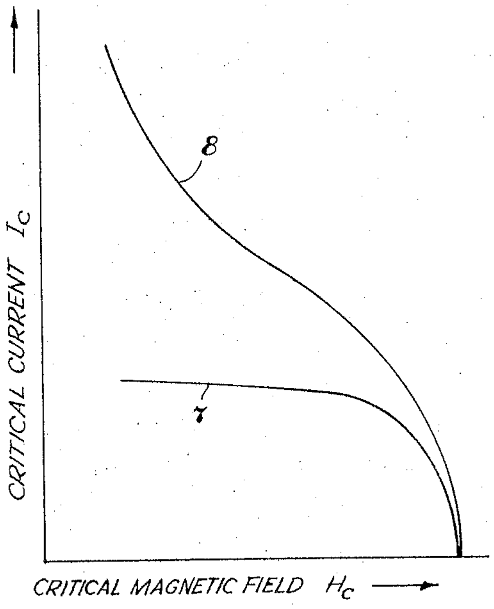
FIGURE 1 is a graph illustrating typical superconducting to normal transition curves at T less than $T_c$ comparing the transition curves of a short superconducting wire and a solenoid fabricated of like superconducting wire.
Figures 2, 3, 4:
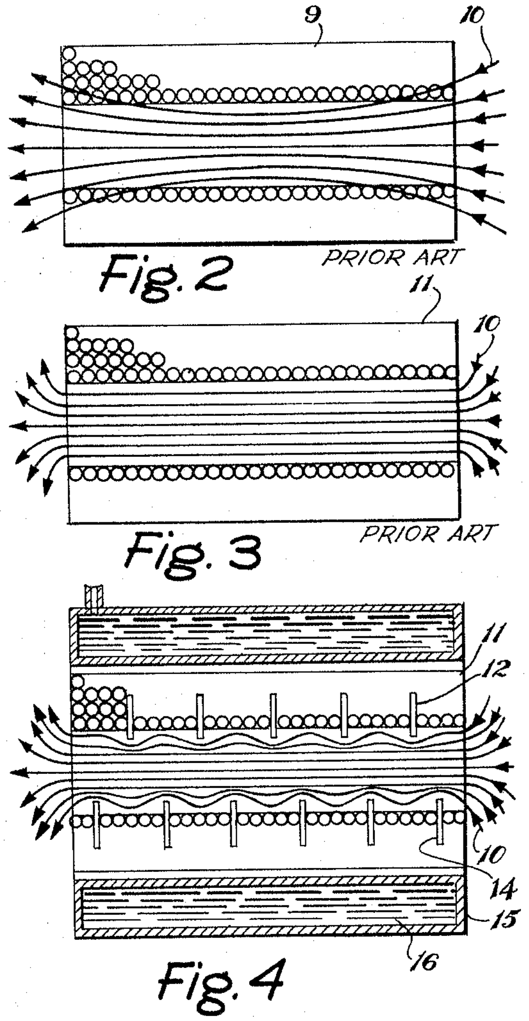
FIGURE 2 is a sectional view of a conventional solenoid including the magnetic field distribution through the center thereof.
FIGURE 3 is a sectional view of a superconducting solenoid including the magnetic field distribution through the center thereof.
FIGURE 4 is a sectional view of a superconducting solenoid embodying the principles of this invention and including the magnetic field distribution through the center thereof.

Referring now to curve 8 of FIGURE 1, there is represented thereby the maximum superconducting current (critical current) that can be obtained at a certain external magnetic field of less than $H_c$. This is termed the transition curve of the particular superconducting wire used. Said curve 8 is obtained by testing a short piece of superconducting wire in an external magnetic field. Experiments have indicated that if a long wire of the same material and the same cross section is wound into a solenoid as shown in FIGURE 3, the transition curve changes as indicated by curve 7 in FIGURE 1. In other words, the maximum superconducting current of such a coil is much lower than that of a short wire of the same material and cross section. Typically, for a given magnitude of magnetic field, a solenoid reverts to normal characteristics at about 50% of the current expected from curve 8. This value may vary depending on other factors such as coil geometry, winding uniformity, winding density, coil diameter, etc. However, transition always takes place at lower than expected currents resulting in inefficient utilization of the superconducting wire. Although this phenomena is not fully understood at this time, one of the main reasons for this effect can be explained with reference to FIGURES 2 and 3 which indicate the difference in the magnetic field distribution inside a coil, between a conventional and a superconducting coil. In FIGURE 2, flux lines 10 are concentrated in the center of the solenoid 9 and in part pass through the inner coil windings. Superconductors on the other hand expel the magnetic field by means of persistent eddy currents which are induced in the superconductor as soon as it is placed in a magnetic field. This is known as the Meissner effect. Consequently for a closely wound coil there is practically no flux leakage in coil 11 of FIGURE 3 as illustrated by flux lines 10. This, however, is achieved at the expense of eddy currents in the wire. This effect is particularly pronounced in the first layer of the winding since it operates in the highest magnetic field. In subsequent layers the magnetic field is considerably lower. The magnitude of these eddy currents reduces the critical current of the solenoid.

In accordance with the principles of this invention, a method is herein proposed for reducing the magnetic field at the surface of the superconducting wires of a solenoid, thereby effecting concomitant reduction of eddy currents therein, which method constitutes placing a plurality of superconducting plates along the interior of said solenoid as indicated by segments 12, 14 of FIGURE 4. The segments 12, 14 of FIGURE 4, being of superconducting material, tend to divert the magnetic flux 10 to the center of solenoid 11. A casing 15 containing liquid refrigerant 16 is provided to maintain the device in superconducting condition. Because of the superconducting properties of the segments, the eddy currents therein cause no losses and have no effect on the operation of the solenoid. Since a complete ring around the solenoid would represent a shorted turn, it is desirable to use two interleaved segments rather than a complete ring.

Differently stated, the eddy currents, which in prior art devices are produced by the magnetic flux in the solenoid, are produced in a plurality of superconducting plates which the invention provides along the interior of the solenoid. Thus the eddy currents are produced in conductors which carry no other current, rather than in the turns of the solenoid itself, which must carry the main magnetic-flux-sustaining current.

Figure 5:
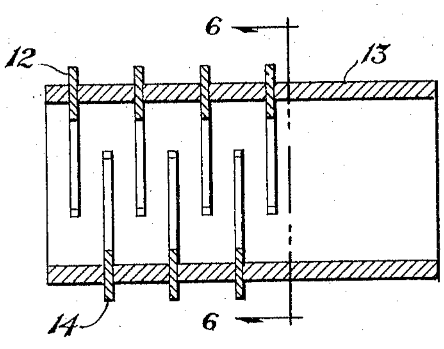
FIGURE 5 is a sectional view of the coil form and superconducting insert segments comprehended by this invention.
Figure 6:
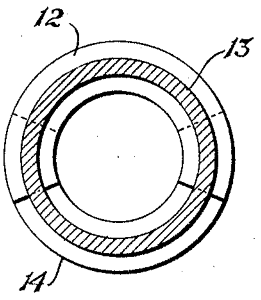
FIGURE 6 is a sectional view of FIGURE 5 taken at 6—6.

FIGURES 5 and 6 illustrate means for fabricating a superconducting solenoid in accordance with the principles of this invention. This is most advantageously accomplished by inserting a plurality of superconducting segments 12, 14 into coil form 13 in interleaved relationship as shown. An insulated superconducting wire (not shown) is then wound thereon in the same manner as in fabricating a conventional solenoid.

The method and techniques described above are equally applicable to all types of coils including toroidal coils and helixes and the like which concentrate their flux in a limited local portion thereof.

Although the above-described arrangements have reference to a particular embodiment of this invention, it is to be understood that the same is by way of example only, the true nature and scope of the invention being defined and limited by the appended claims.

Having thus described the invention, what is claimed as new and desired to be secured by Letters Patent is:

1. A superconducting device comprising a coil of superconducting material having at least two turns and magnetic flux diverting means disposed therein, said flux diverting means being adapted to reduce the flux density contiguous to the inner circumference of said coil, wherein said flux diverting means comprises a plurality of open circuited ring shaped superconducting members disposed at intervals within said coil coaxial therewith so as to protrude a distance beyond the inner circumference thereof.

2. A superconducting coil comprising a cylindrical member comprising a plurality of contiguous turns of a wire of superconducting material, a plurality of segments of superconducting material intermittently disposed within said coil along the inner surface thereof in transverse relationship to the axis of said coil, and means for maintaining said coil, and said segments in a superconducting condition.

References Cited by the Examiner

Gilmore, K.: "Cryogenics—Electronics at Ultra-Low Temperatures," Electronics World, July 1962 (pages 23–26, 84 and 85 relied on).

Swartz et al.: "Characteristics and a New Application of High-Field Superconductors," Journal of Applied Physics, July 1962 (pages 2292–2300 relied on).

BERNARD A. GILHEANY, *Primary Examiner.*

JOHN F. BURNS, LARAMIE A. ASKIN, *Examiners.*